United States Patent [19]
Sabatini et al.

[11] Patent Number: 5,592,418
[45] Date of Patent: Jan. 7, 1997

[54] NON-VOLATILE ANALOG MEMORY CELL WITH DOUBLE POLYSILICON LEVEL

[75] Inventors: Marco Sabatini, Brescia, Italy; Alan Kramer, Berkley, Calif.

[73] Assignee: SGS-Thomson Microelectronics, S.r.l., Agrate Brianza, Italy

[21] Appl. No.: 367,068

[22] Filed: Jan. 3, 1995

[30] Foreign Application Priority Data

Dec. 31, 1993 [EP] European Pat. Off. .............. 93830538

[51] Int. Cl.⁶ ..................................................... G11C 11/40
[52] U.S. Cl. .................. 365/185.18; 365/185.03
[58] Field of Search ................ 365/185.03, 185.18, 365/185.21, 185.01, 149

[56] References Cited

U.S. PATENT DOCUMENTS

| | | | |
|---|---|---|---|
| 3,430,112 | 2/1969 | Hilbourne | 317/235 |
| 4,717,943 | 1/1988 | Wolf | 365/185.01 |
| 4,727,515 | 2/1988 | Hsu | 365/185.03 |
| 4,852,062 | 7/1989 | Baker | 365/185.15 |
| 5,245,569 | 9/1993 | Gonzalez | 365/185.18 |
| 5,264,734 | 11/1993 | Holler et al. | 307/201 |

FOREIGN PATENT DOCUMENTS 59-074679  4/1984  Japan.

OTHER PUBLICATIONS

R. R. Troutman, Staggered Channel EPROM/EAROM, IBM Technical Disclosure Bulletin, vol. 23, No. 4, Sep., 1980, pp. 1375–1376.

Chi–Kai Sin, et al., EEPROM as an Analog Storage Device, with Particular Applications in Neural Networks, IEEE Transactions on Electron Devices, vol. 39, No. 6, Jun., 1992, pp. 1410–1419.

A. Kramer, et al., Flash–Based Programmable Nonlinear Capacitor for Switched–Capacitor Implementations of Neural Networks, 1994, no month available.

*Primary Examiner*—A. Zarabian
*Attorney, Agent, or Firm*—Robert Groover; Betty Formby

[57] ABSTRACT

Non-volatile memory cell with double level of polycrystalline silicon has a source region (38), a drain region (31), a channel region (34) between said source and drain regions, a floating gate (33), and a control gate (32) in which the channel region area extends into two lateral zones beneath the two gates and perpendicular to the source-drain direction.

22 Claims, 6 Drawing Sheets

NON-VOLATILE ANALOG MEMORY CELL WITH DOUBLE POLYSILICON LEVEL

CROSS-REFERENCE TO RELATED APPLICATION

This application claims priority from EPC App'n 93830538.0, filed Dec. 31, 1993, which is hereby incorporated by reference. However, the content of the present application is not necessarily identical to that of the priority application.

BACKGROUND AND SUMMARY OF THE INVENTION

The present invention relates to non-volatile memory cells with double level of polycrystalline silicon and in particular an electrically erasable non-volatile memory cell (FLASH EEPROM) designed for use in analog computing devices in the charge domain.

Such devices are designed to process input signals in analog form to supply output signals again in analog form and are used in associative memories for pattern recognition systems, in associative memories for correction of digital data transmission errors, in D/A converters and neural networks.

In the prior art said devices are provided by means of digital circuits.

The use of digital circuits however requires converting the analog input signals into digital signals, processing the signals in digital form and reconverting said signals in analog form.

The considerable circuit complexity of said devices is in contrast with the present tendency toward integrating an ever greater number of circuits on the same chip to obtain higher computing powers with low consumption and low power dissipation.

The technical problem underlying the present invention is to make available to those skilled in the art a capacitive element with non-linear characteristic, programmable in analog mode, of very small size, such as to make possible the provision of analog computing devices with very high density occupying a particularly small integration area.

This problem is solved by a non-volatile double-poly memory cell in which the channel region extends laterally, perpendicular to the source-drain direction, into two lateral zones beneath the two gates. This provides more favorable capacitive coupling.

The characteristics and advantages of the device in question are set forth in the description of a preferred embodiment thereof given below by way of nonlimiting example with reference to the annexed drawings.

At least one prior art EPROM design has used a gate shaped like a cross: This structure appears in U.S. Pat. Nos. 4,698,900 and 4,892,840, which are both hereby incorporated by reference. Note that the basic capacitance relations followed by these patents is quite different from that of the present invention, since these patents teach that: "For maximum programming efficiency . . . it is desirable to maintain a large capacitance between the control gate and the floating gate, and a minimum capacitance between the floating gate and the underlying semiconductor substrate . . . ." (U.S. Pat. No. 4,892,840). This is done in order to maximize the voltage between the floating gate and substrate, when the control gate is pulled high. (The series combination of capacitances acts as a voltage divider.)

Additional background on neural networks and analog memory can be found in the following publications, all of which are hereby incorporated by reference: Sin et al., "EEPROM as an analog storage device, with particular applications in neutral networks," 39 IEEE TRANSACTIONS ON ELECTRON DEVICES 1410 (June 1992); Alspector et al., "A neuromorphic VLSI learning system," Proc. 1987 Stanford Conf. on Advanced Research in VLSI 313; A. P. Chandrakasan et al., "Low-Power CMOS Digital Design," 27 IEEE J. Solid State Circuits 473 (1992); O. Fujita and Y. Amemiya, "A Floating-Gate Analog Memory Device for Neural Networks," 40 IEEE Trans. Electron Devices 2029 (1993); M. Holler et al., "An Electrically Trainable Neural Network Chip (ETANN) with 1024 'Floating Gate' Synapses," in Proc. IJCNN, June 1989, pp. 2.191–2.196; J. Lazzaro, J. Wawrzynek, A. Kramer, "Systems Technologies for Silicon Auditory Models", 14 IEEE Micro No.3, pp. 7–15, (June 1994); A. Kramer et al., "EEPROM Device as a Reconfigurable Analog Element for Neural Networks," 1989 IEDM Tech. Dig., paper 10.3; A. Kramer et al., "Compact EEPROM-based Weight Functions," in Neural Information Processing Systems 3 at 1001–1007 (ed. R. P. Lippmann et al. 1991); T. Ong, P. K. Ko, and C. Hu, "The EEPROM as an Analog Memory Device," 36 IEEE Trans. Electron Dev. 1840 (1989); T. Shibata and T. Ohmi, "A Functional MOS Transistor Featuring Gate-Level Weighted Sum Threshold Operations," 39 IEEE Trans. Electron Devices 1444 (1992); C. Mead. "Analog VLSI and Neural Systems" (1989); all of which are hereby incorporated by reference.

BRIEF DESCRIPTION OF THE DRAWING

The disclosed inventions will be described with reference to the accompanying drawings, which show important sample embodiments of the invention and which are incorporated in the specification hereof by reference, wherein:

FIG. 12 shows how a standard flash cell is modified for use in analog circuits.

DETAILED DESCRIPTION OF THE PREFERRED EMBODIMENTS

Figure 5:
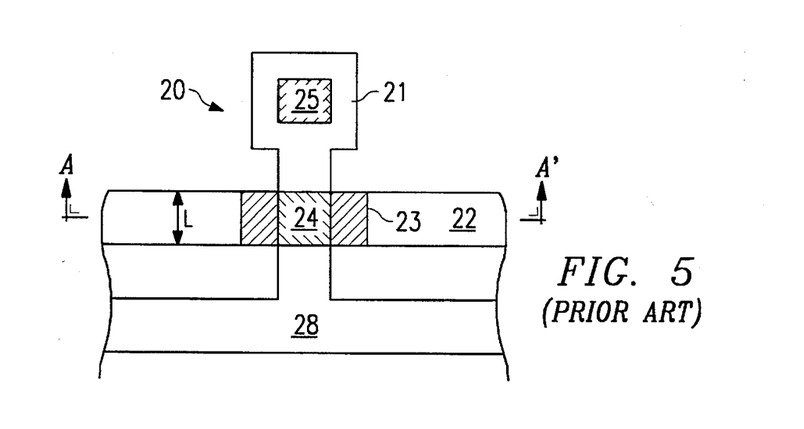
FIGS. 5 and 6 show a plan view and a cross section view respectively of a standard FLASH EPROM memory cell.
Figure 6:
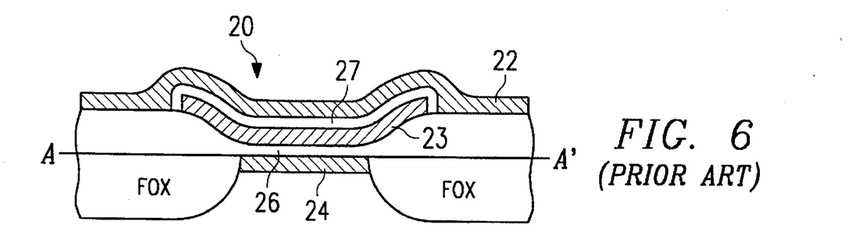

The numerous innovative teachings of the present application will be described with particular reference to the presently preferred embodiment (by way of example, and not of limitation), in which:

With reference to FIGS. 5 and 6 showing a FLASH EEPROM memory cell of known type and designated as a whole by 20 there can be distinguished a source region 28 and a drain region 21 formed in a substrate of semiconductor material and which define a channel region 24 (also referred to as "active area") between them. Reference 25 designates the contact to the drain region 21.

Over the channel region 24 is a floating gate 23 which is separated from the substrate by a thin dielectric layer 26.

Over the floating gate 23 is a control gate 22 separated from the gate 23 by a second dielectric layer 27.

Figure 4:
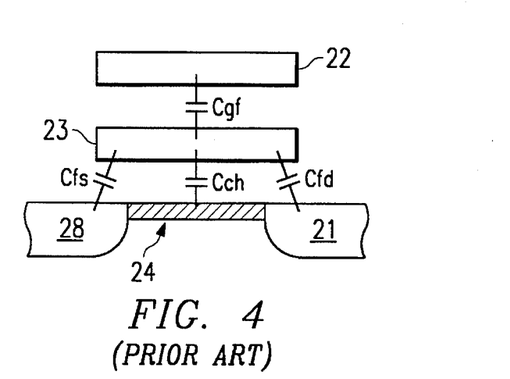
FIG. 4 shows a cross section of the conventional structure of a FLASH EEPROM memory cell showing the principal capacitances present.

The channel region 24 between the source region 28 and drain 21 region displays (when biased above the threshold $V_T$) a capacitance Cch toward the floating gate designated symbolically in FIG. 4 where are shown the principal capacitances of a generic FLASH EEPROM cell.

FIG. 4 also shows two so-called "overlap" capacitances Cfs and Cfd between the floating gate 23 and the source region 28 and between the floating gate and the drain region 21 respectively.

Figure 7:
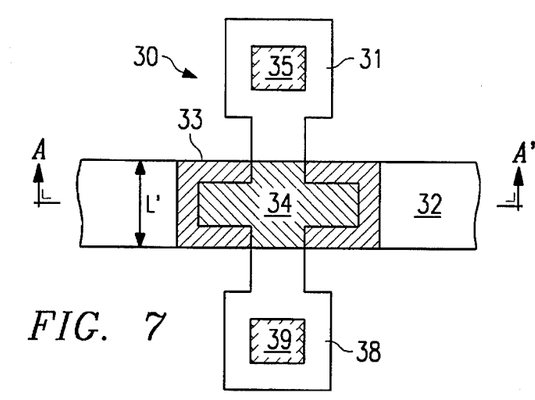
FIGS. 7 and 8 show a plan view and a cross section view respectively of a FLASH EEPROM memory cell in accordance with the present invention.
Figure 8:
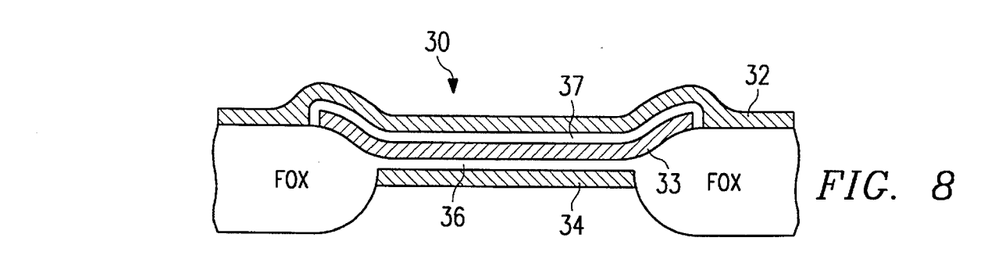

FIGS. 7 and 8 show a FLASH EEPROM memory cell in accordance with the present invention designated as a whole by 30.

A source region 38 and a drain region 31 whose contacts are designated by 35 and 39 are defined in the substrate of semiconductor material.

The principal difference between the cell 20 and the cell 30 lies in the configuration of the channel region 34 which extends not only into the zone directly between the source region 38 and drain region 31 but also in two lateral zones adjacent to said zone and, like it, beneath the floating gate 33 and the control gate 32.

The two gates 32, 33 have greater dimensions than those of the cell 20 because they must reliably cover the active channel region 34 widened in accordance with the present invention.

In addition, to increase the channel capacitance value, holding changed the values of the two overlapping capacitances between floating gate and source region and between floating gate and drain region, value, the active channel region 34 displays a cross configuration in the preferred embodiment.

Consequently even the length L' of the channel 34 is greater than the length L of the channel 24 of the cell 20.

But this does not compromise the normal programmability of the cell.

The channel region is defined in the substrate by thick oxide regions in conformity with lithographic techniques known to those skilled in the art.

In the analog computing devices in the charge domain which use non-volatile memory cells said cells are used as condensers with non-linear characteristics by measuring the quantity of charge accumulated by a cell when it is subjected to a certain potential difference.

These non-linear characteristics of the cell derive from the same MOS field effect transistor structure of the memory cell.

In MOS devices the charge accumulated in the channel is almost null when the gate voltage (Vg) is lower than the threshold voltage (Vt) of the device and, in a first approximation, is linear in (Vg-Vt) when the gate voltage (Vg) is greater than the threshold voltage (Vt).

Figure 1:
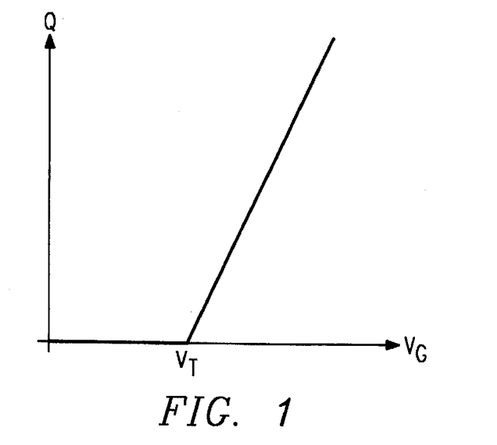
FIG. 1 shows the ideal characteristic curve between the control gate voltage (Vg) and the charge (Q) accumulated in the control gate of a hypothetical FLASH EEPROM cell designed for use in analog computing devices in the charge domain.

FIG. 1 shows the ideal curve of the characteristic between the gate voltage (Vg) and the accumulated charge (Q).

Figure 2:
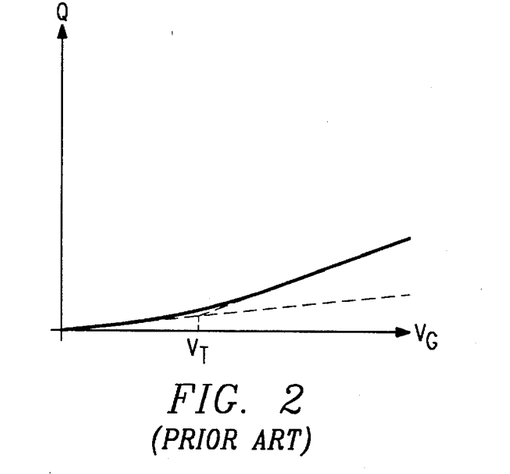
FIG. 2 shows the real characteristic curve between the control gate voltage (Vg) and the charge (Q) accumulated in the control gate of a FLASH EEPROM cell.

The real characteristic shown in FIG. 2 of a known non-volatile memory cell of the FLASH EEPROM type differs from the ideal one by the presence of some parasitic capacitances.

FIG. 4 shows schematically the conventional structure of a FLASH EEPROM cell with accentuation, as mentioned above, of the principal capacitances present.

It can be seen that the channel capacitance (Cch) which represents the "signal" of the system, when the source region (28) and drain region (21) are equipotential, is in parallel with the two "overlap" capacitances between floating gate and source (Cfs) and between floating gate and drain (Cfd).

In this manner the induced charges on Cfs and Cfd represent an "error" signal for the system.

The fourth capacitance present (Cgf) between control gate (22) and floating gate (28) is in series with the other three capacitances.

In a normal FLASH EEPROM cell the channel capacitance (Cch) is of the same order of magnitude as the parallel of the two overlapping capacitances and, as may be seen from the real characteristic curve in FIG. 2, this causes considerable shifting of the resulting characteristic curve from the ideal characteristic of FIG. 1.

Since it is not possible to lower the capacitance values of the two overlap zones without compromising cell operation, the solution of the problem in accordance with the present invention consists of increasing the capacitance of the channel region and consequently increasing the ratio of the channel region capacitance (signal) to the overlap parasitic capacitance of source and drain (error).

In accordance with the present invention the capacitance of the channel region is increased as shown in FIG. 7 and FIG. 8 by extending the channel region area perpendicularly to the source-drain direction in two side zones also extending under the floating gate and the control gate, which are widened.

Figure 3:
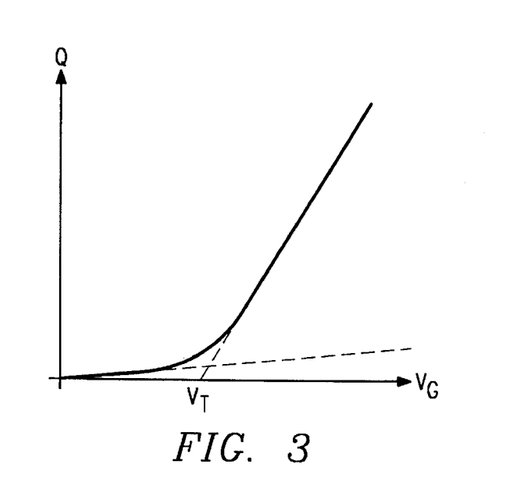
FIG. 3 shows the real characteristic curve between the control gate voltage (Vg) and the charge (Q) accumulated in the control gate of a FLASH EEPROM cell in accordance with the present invention.

This solution permits achieving a characteristic curve between control gate voltage (Vg) and charge accumulated in the control gate (Q) of the type shown in FIG. 3 which approximates the ideal characteristic curve of FIG. 1.

As in the other memory cells of the same type, by varying the quantity of charge accumulated in the floating gate in the cell programming phase it is possible to vary continuously the threshold voltage (Vt) and hence the characteristic curve of the cell.

It is clear that modification, integration and replacement of elements can be made to the embodiment described above by way of nonlimiting example without thereby going beyond the protective scope of the following claims.

Sample Neural Network Embodiment

The use of Flash devices for both analog storage and analog computation can result in highly efficient switched-capacitor implementations of neural networks. The standard Flash device suffers from severe limitations in this application due to relatively large parasitic overlap capacitances relative to a channel capacitor. The following text describes a computational concept, circuit and architecture in which the device structure of FIG. 7 can be advantageously employed. This context is not by any means the only one in which the disclosed device structure can be employed, but provides an illustration of the operation of the disclosed device structure. The following text also provides some additional specifics regarding the presently preferred embodiment of the device structure. This text, and FIGS. 9–21, generally corresponds to the paper "Flash-Based Programmable Nonlinear Capacitor for Switched-Capacitor Implementations of Neural Networks" which was given by the present inventors at the 1994 IEDM, and which is hereby incorporated by reference.

Figure 12:
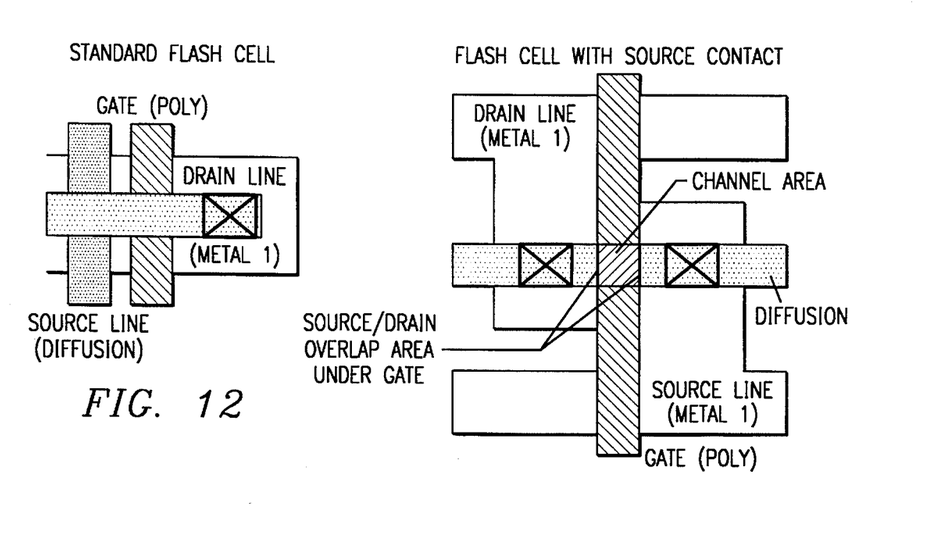
FIG. 12 shows the relation of channel charge to gate voltage for a floating-gate MOSFET.

FIG. 12 is a plot of channel charge versus gate voltage for a floating gate MOSFET. The curve shows the idealized function.

Figure 9:
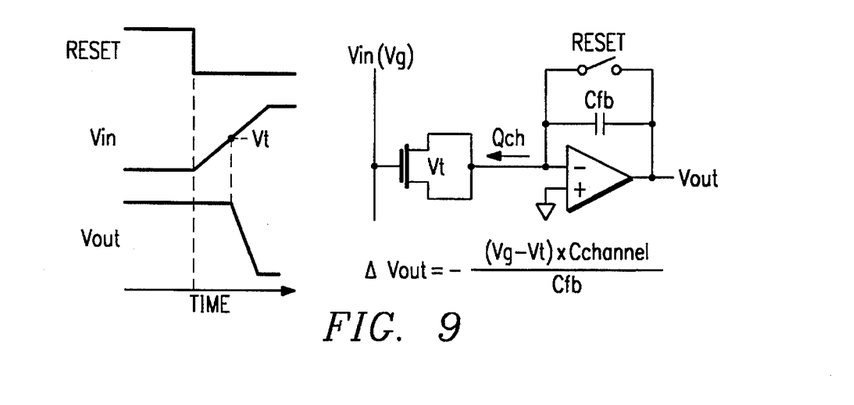
FIG. 9 shows a circuit for converting channel charge to a voltage signal.

FIG. 9 shows channel charge to voltage conversion. After resetting the charge integrator, the input is applied.

Figure 10:
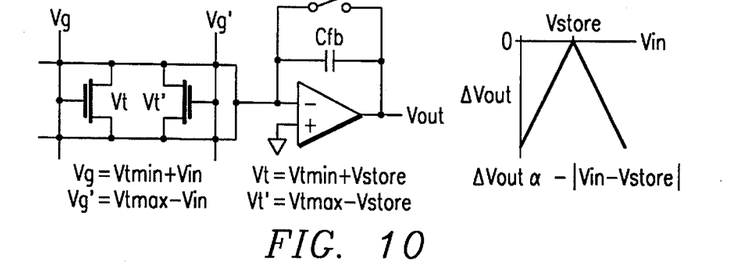
FIG. 10 shows a sample Absolute Value Circuit.

FIG. 10 shows an Absolute Value Circuit. Using differential signalling for the input Vin and the stored value Vstore, (the value stored on the pair of floating gates), a second device can provide the other "half curve" needed for the absolute value of difference function.

Figure 11:
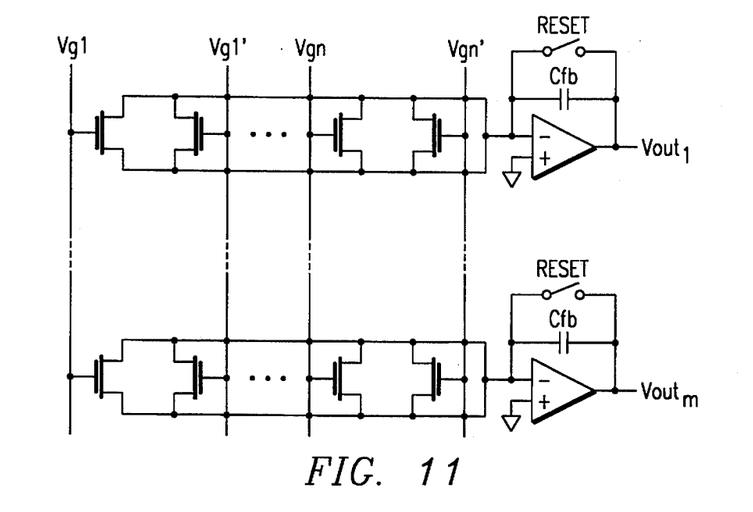
FIG. 11 shows the architecture of the Manhattan Distance Computing Array.

FIG. 11 shows the architecture of the Manhattan Distance Computing Array. The inputs are applied simultaneously to the gates. Distances are computed in parallel.

FIG. 12 shows modifications to the standard Flash cell. Parallel source/drain lines are needed to avoid charge sharing among lines.

Figure 13:
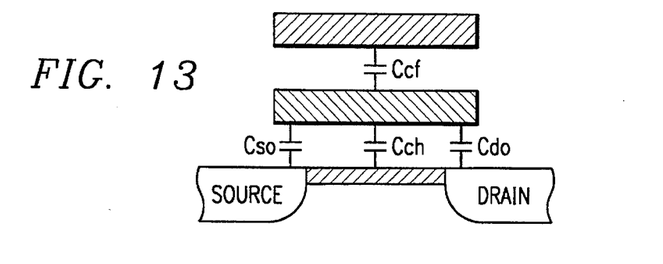
FIG. 13 is very similar to FIG. 4, and shows labels for the various capacitances in the cell of FIG. 12.

FIG. 13 shows principal Flash cell capacitances. The Parasitic Gate overlap capacitances, Cso and Cdo dominate parasitics from gate to source/drain.

Figure 14:
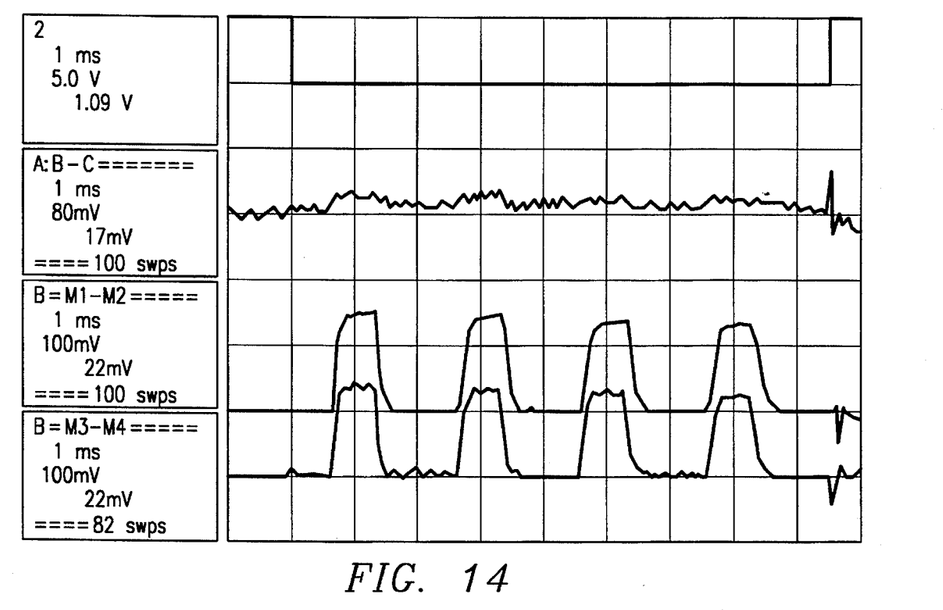
FIG. 14 shows measurements of the channel and parasitic capacitances in the structure of FIG. 9.

FIG. 14 shows measurement of the "standard" cell channel and parasitic capacitances showing dominant parasitics on the circuit of FIG. 9. The input is cycling up and down and the delta output is a relative measure of capacitance. The lower trace is for a programmed device (parasitics only) and shows a 140 mV differential while the second trace is for an erased device (parasitics plus channel) and shows close to a 160 mV differential. The difference between the two traces is a measure of the channel capacitance and, at 17 mV, demonstrates that the channel capacitance is less than 15% of the parasitics.

Figure 15:
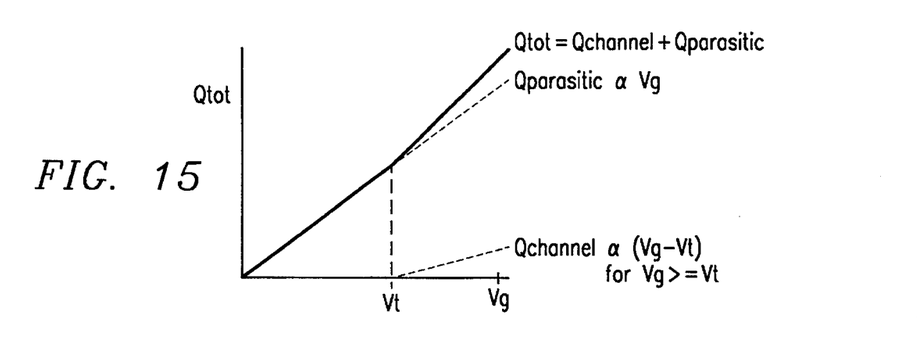
FIG. 15 shows the relation between charge and gate voltage which is indicated by the data of FIG. 14.

FIG. 15 shows an actual Q(V) curve for the cell of FIG. 12 as determined from the data of FIG. 14. The parasitics have been measured to be 1fF while the channel capacitance is less than a seventh of that. The effect of the parasitics is to introduce a large common-mode error signal in the charge domain.

Figure 16:
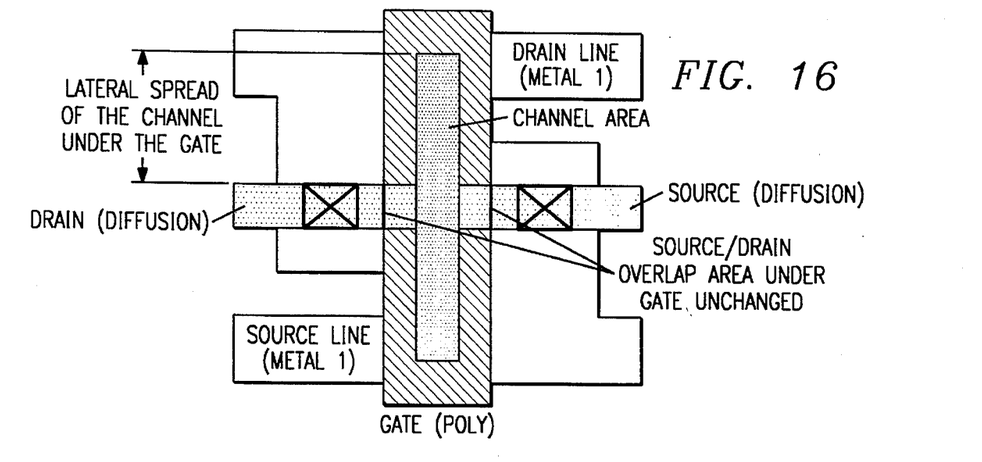
FIG. 16 shows a further modification of the cell of FIG. 12, and represents the presently preferred embodiment of the cell of FIG. 7.

FIG. 16 shows a further modification of the cell of FIG. 12, and represents the presently preferred embodiment of the cell of FIG. 7.

Figure 18:
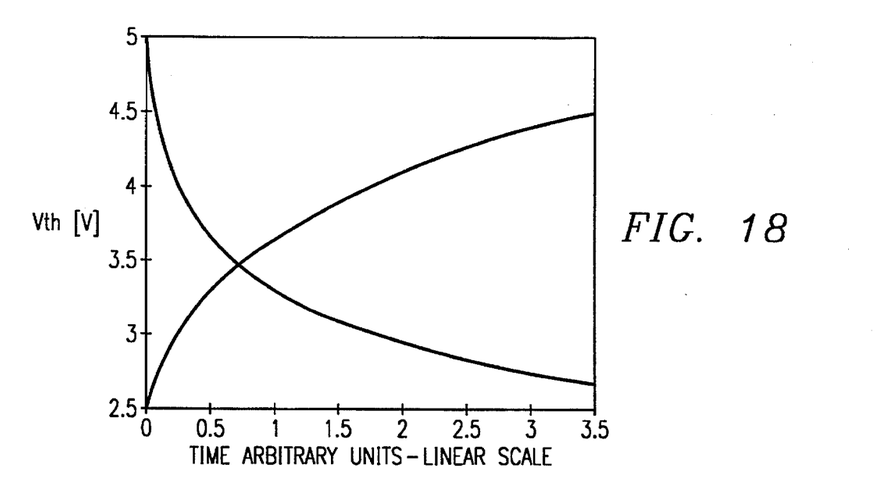
FIG. 18 shows programmation and erasure curves for the device of FIG. 16.

FIG. 18 shows programming and erasing curves for the device of FIG. 16. The two curves are not on the same time scale. The programming conditions were Vgs=8 V and Vds=5.5 V. Erasing conditions were Vgs=.9.0 V (drain floating).

Figure 19:
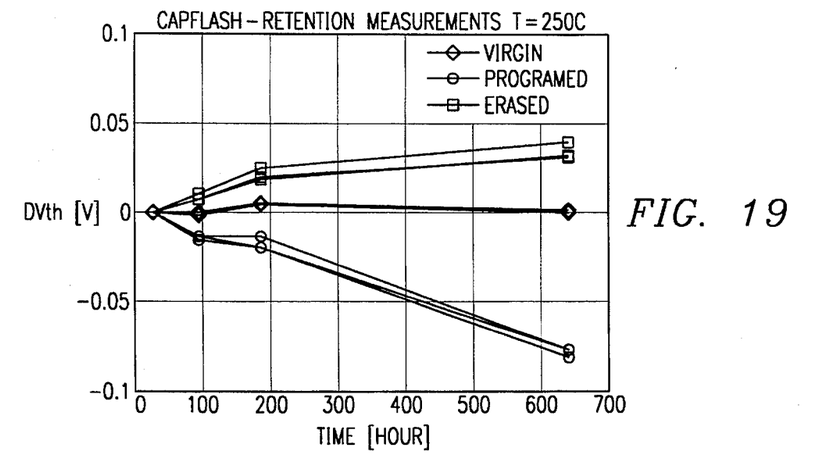
FIG. 19 shows analog retention data for the cell of FIG. 16.

FIG. 19 shows analog Retention Measurements. Four virgin, programmed (virgin +2 V) and erased (vt −2 V) cells were stressed for up to 650 hours at 250° C.

Figure 20:
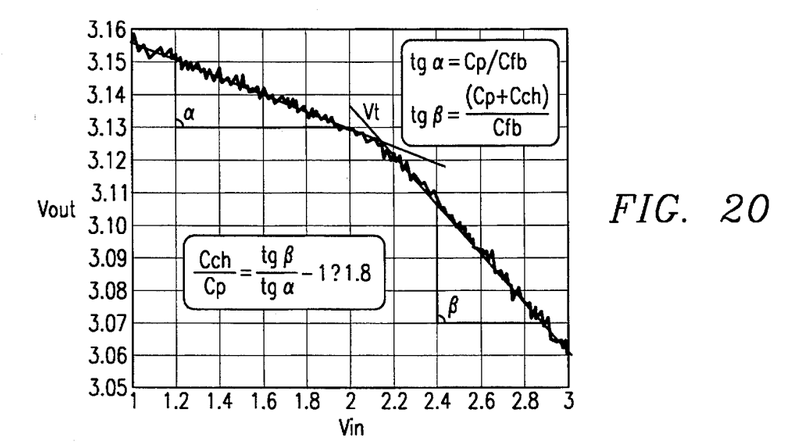
FIG. 20 shows measured Q/V data for the cell of FIG. 16.

FIG. 20 shows Q-V Characteristics of the cell of FIG. 16. Measurements are made on a simple test structure such as that shown in FIG. 9. Charge integrator outputs, which are inverted, are shown. The data indicate that the Cch of the CAPFLASH device is more than 2.5 times $Cp=C_{so}+C_{do}$.

Figure 21:
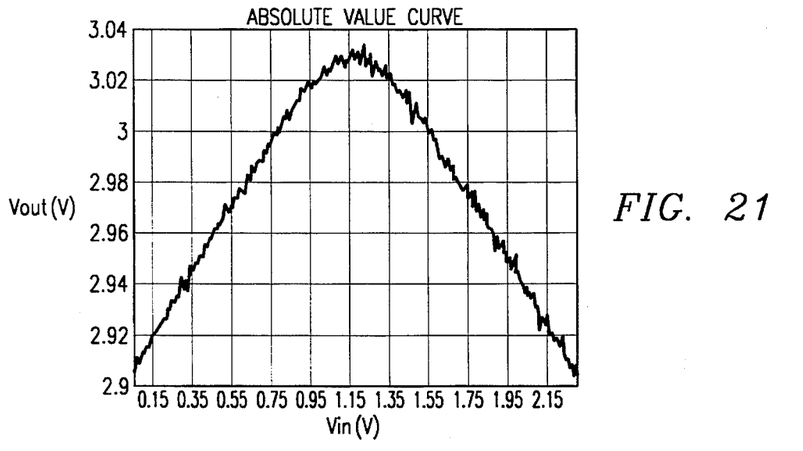
FIG. 21 shows how absolute value is computed using the circuit of FIG. 10.

FIG. 21 shows Computation of Absolute Value using two CAPFLASH devices (circuit shown in FIG. 10). Charge integrator output is shown.

These devices are demonstrated in a novel circuit consisting of only two devices and capable of computing a 5-bit absolute-value-of-difference at an energy consumption of less than 1pJ.

Analog implementations of Neural Network Architecture's provide a framework for computation which is more efficient than standard digital techniques when applied to problems of the right class. The purpose of this work is to explore the viability of this approach on large scale using novel techniques based on Flash-EEPROM technology. Our target is to realize an analog computing circuit containing on the order of $10^6$ analog computing elements, each based on a highly efficient circuit containing two novel devices and occupying an area of 70.r$\mu$m$^2$ (0.7 $\mu$m technology), and each capable of computing in parallel the absolute value of the difference between a stored analog value and an input analog value to a precision of 5–7 bits. The target is a chip capable of computing 4K 64-dimensional Manhattan distances in less than 2 $\mu$sec at a power consumption of less than 150 mW. A single chip capable of computing 128 Gigaoperations (5-bit absolute-value-of-difference-accumulate operations) per second at 150 mW represents an increase in efficiency both in terms of density and power consumption of more than an order of magnitude over the best low-power digital techniques.

The scale of our implementation requires a low-power switched-capacitor (charge-domain) approach which is impractical using standard Flash devices because of problems due to relatively large parasitic overlap capacitances. This paper introduces the computational concept, circuit and architecture we are exploring, measurements characterizing the charge-domain properties of standard Flash devices demonstrating severe limitations for our approach, and development and characterization of a new device with much improved properties for our application. Essentially, the novel device we present is a Flash-based programmable nonlinear capacitor with a more than 1500% (15×) improvement in the ratio between the channel capacitance and the parasitic gate-source/drain overlap capacitances at a cost of less than a 40% increase in cell area. This device introduces a far smaller problem with common mode charge due to parasitics than the standard device and thus make the realization of a large-scale analog computing circuit based on this architecture possible. These devices are demonstrated in a novel circuit consisting of only two devices and capable of computing a 5-bit absolute-value-of-difference at an energy consumption of less than 1pJ.

Analog Storage and Computation with Flash EEPROMs

The use of floating gate technology for efficient long-term analog storage is well explored, especially in neural network implementations. Typically, these devices are employed only for storage, providing input to larger analog computational circuits such as multiplying amplifiers. In this work, we extend the use of these devices by using a single Flash-EEPROM based device for both analog storage and analog computation, resulting in a large increase in computational efficiency. This is done by making use of the MOS physics controlling the charge in the channel of a floating gate transistor to perform a nonlinear difference operation. The charge in the channel of a MOS transistor is nonlinear: below Vt the channel charge is effectively 0, while above Vt it is linear in (Vg - Vt) (FIG. 12). In the case of a floating gate device, this nonlinearity is programmable. By storing one analog value as the threshold of a floating gate device, applying a second analog value on the gate of the device and measuring the channel charge with a charge integrator, it is possible to efficiently compute the amount by which the gate voltage exceeds the threshold voltage (FIG. 9).

Distance Computation

The use of differential signaling allows a pair of these devices to be programmed so that their combined channel charge represents the absolute-value of the difference between two analog values. The two devices have their threshold voltages programmed and their gate voltages applied in a differential manner (FIG. 10).

The computation of the Manhattan Distance between two vectors requires the sum of the absolute values computed in each dimension, and conservation of charge allows many absolute-value computing circuits to be row-connected to a single common charge integrator which can then efficiently compute the Manhattan distance between the vector stored on the gates of the devices in the row, and the vector applied on the gates. In addition, many such rows can be accessed by the columnar gates in parallel, allowing for a highly-efficient array-based architecture for the parallel computation of the Manhattan distances between a set of row-stored vectors and a single column-applied gate vector (FIG. 11).

Standard Flash cell

To allow parallel source/drain access and to prevent charge sharing among rows, the standard flash cell layout (parallel source/gate) must be modified (FIG. 12). These modified "standard" devices have several parasitic capacitances which influence the charge characteristics of the device (FIG. 14). Most important among these are the gate-source and gate-drain overlap capacitances whose sum we call Cp. A small test circuit has been fabricated and tested to measure the size of Cp relative to the channel capacitance Cch. The results indicate that for these "standard" devices the parasitics are more than 6 times larger than the channel capacitance above threshold. Because the charge integrator must measure the channel charge through the source and the drain, it is unable to distinguish between charge drawn into the channel and charge drawn into parasitic gate-source/drain overlap capacitances. These parasitics thus create a common-mode error signal which must be compensated for the channel charge to be determined.

CAPFLASH Device

A new device has been developed to reduce the problem introduced by gate-source/drain overlap parasitics. The essential idea of the new device is to flare the channel out laterally underneath the gate, thus greatly increasing the effective channel area while leaving the overlap parasitics effectively unchanged (FIG. 16). The impact on cell size is minimal; as the gate area next to the channel already existed, the only expense was that of increasing the gate length enough to safely flare out the channel. The layout of the CAPFLASH cell allows us to increase the drawn channel area by almost a factor of 10 (from 0.64 $\mu m^2$ to 5.9 $\mu m^2$) while increasing the total cell size by less than 40% more than that of the "standard" cell (25.6 $\mu m^2$ to 35.2 $\mu m^2$).

A. CAPFLASH Programming and Retention

While the new device has an effective channel length more than double that of the "standard" device (2.0 $\mu m$ vs. 0.8 $\mu m$), its programmability has been confirmed, though at somewhat higher voltages than for "standard" devices (FIG. 18). We have programmed these devices to analog precision of better than 8 bits (8 mV) confirming typical results. In addition, charge retention has been characterized and the preliminary results are encouraging; charge loss in a maximally programmed (Vt=2 V above virgin) or a maximally erased (Vt=2 V below virgin) device following a 500-hour bake at 250° C. has been less than 64 MV, corresponding to a retention of more than 5 bits for more than 10 years at 125° C. Our target chip will be ultra low-power and so should run at temperatures far below this, thus we expect actual retention times for our application to be even greater.

B. CAPFLASH Channel and Parasitic Capacitances

We have characterized the charge-domain properties of the CAPFLASH cell and have found are more than 1500% (15×) increase in the relative size of the Cch with respect to Cp (FIG. 20). While for the standard device Cch/Cp=0.13, in the shortening is the most likely explanation for the measured channel area increasing by more than the drawn ratio. This improved characteristic represents a signal-to-error ration which makes the device usable for the target application.

Mismatch characteristics of devices often play a critical role in determining the overall precision of analog computing circuits. In the case of this circuit, any mismatch in Cch from one device in the array to another will obviously effect the relative outputs given by two cells which receive the same inputs. A preliminary characterization of the mismatch among 1024 CAPFLASH devices in an array of 512 rows found the worst-case mismatch in Cch to be less than 2%. This represents a precision of 5½ bits and is encouraging for our goal of 5-bit overall precision.

C. Computation with the CAPFLASH Device

A circuit for the computation of Manhattan Distance based on 2 CAPFLASH and a charge integrator (FIG. 10) has been tested (FIG. 21). The results demonstrate the viability, at least on a small scale, of the use of a single floating-gate device for both analog storage and ultra-efficient analog computation. In addition, we have built and tested an array such as that shows in FIG. 11 containing 64 input columns and 512 rows. The array computes in parallel 512 64-dimensional Manhattan distances at a frequency in excess of 500 kHz. The total power consumption of the circuit, dominated by the bias currents needed by the 512 charge integrators, has been measured at less than 16 mW (3.2mA×5 V). The array is performing 32K operations in 2 $\mu s$, thus the energy consumption per absolute-value cell is less than 1pJ per operation (16 mW×2 $\mu s$/32K). The overall precision of the individual computing cells has been characterized and exceeds 5 bits.

The device physics of floating-gate MOS transistors can be used to compute Manhattan Distance in a switched-capacitor neural network architecture. Standard Flash EEPROM devices have a small ratio between channel capacitance and parasitic gate-source/drain overlap capacitances which make them unattractive for this application. The CAPFLASH, a novel flash-based programmable non-linear capacitor with greatly improved ratio between Cch and Cp has been developed and characterized. This new device improves the ratio of Cch to Cp by 1500% while increasing device area by less than 40%. Programmability, analog retention, and channel capacitance mismatch have all been characterized and the initial results are promising. The CAPFLASH device has been used for both analog storage and computation, allowing the implementation of ultra-efficient programmable computing circuits containing only two devices and capable of computing a 5-bit absolute-value-of difference-accumulate operation at an energy consumption of less than 1pJ.

According to a disclosed class of innovative embodiments, there is provided: An integrated circuit analog memory, comprising: a memory cell, comprising source and drain diffusions of a first type, and a channel region separating said source diffusion from said drain diffusion; a first conductive thin film gate layer, overlying and capacitively coupled to and insulated from said channel region; and a second conductive thin film gate layer, overlying and capacitively coupled to and insulated from said first conductive thin film gate layer and said channel region; wherein at least one of said gate layers has a width over said channel which is greater than the width thereof over said source and drain regions; sensing circuitry, connected to sense, and to provide a voltage output corresponding to, the charge stored in said memory cell, without applying current between source and drain thereof; and write circuitry, connected to controllably inject charge into said first conductive thin film layer of said memory cell.

According to another disclosed class of innovative embodiments, there is provided: An integrated circuit analog memory, comprising: a memory cell, comprising source and drain diffusions of a first type, and a channel region separating said source diffusion from said drain diffusion; a totally insulated first conductive thin film gate layer, overlying and capacitively coupled to said channel region; and a second conductive thin film gate layer, overlying and capacitively coupled to and insulated from said first conductive thin film gate layer and said channel region; wherein at least one of said gate layers has a width over said channel which is greater than the width thereof over said source and drain regions; sensing circuitry, connected to sense, and to provide a voltage output corresponding to, the charge stored in said memory cell, without applying current between source and drain thereof; and write circuitry, connected to controllably inject charge into said first conductive thin film layer of said memory cell.

According to another disclosed class of innovative embodiments, there is provided: An integrated circuit analog memory, comprising: a memory cell, comprising source and drain diffusions of a first type, and a channel region separating said source diffusion from said drain diffusion; a first conductive thin film gate layer, overlying and capacitively coupled to and insulated from said channel region; and a second conductive thin film gate layer, overlying and capacitively coupled to and insulated from said first conductive thin film gate layer and said channel region; wherein each said gate layer comprises an extended portion which is laterally extended over said channel in a direction which is not parallel to the source-drain axis, and which is laterally separated from said source and drain regions; sensing circuitry, connected to sense, and to provide a voltage output corresponding to, the charge stored in said memory cell, without applying current between source and drain thereof.

According to another disclosed class of innovative embodiments, there is provided: An integrated circuit analog memory, comprising: a memory cell, comprising source and drain diffusions of a first type, and a channel region separating said source diffusion from said drain diffusion; a first conductive thin film gate layer, overlying and capacitively coupled to and insulated from said channel region; and a second conductive thin film gate layer, overlying and capacitively coupled to and insulated from said first conductive thin film gate layer and said channel region; and a first metal conductor, insulated from said first and second conductive thin film gate layer and said channel region, which makes ohmic contact to said source region; a second metal conductor, insulated from said first and second conductive thin film gate layer and said channel region, which makes ohmic contact to said drain region; wherein each said gate layer has a width over said channel which is greater than the width thereof over said source and drain regions; sensing circuitry, connected to sense, and to provide a voltage output corresponding to the charge stored in said memory cell, without applying current between source and drain thereof.

According to another disclosed class of innovative embodiments, there is provided: Non-volatile memory cell with double level of polycrystalline silicon integrated monolithically in a substrate of semiconductor material and comprising a source region (38), a drain region (31), a channel region (34) between said source and drain regions, a floating gate (33), and a control gate (32) defined in said levels of polycrystalline silicon and separated by at least one layer of dielectric material (37) and both extending at least on the channel region which is covered by a thin layer of dielectric material (36) and characterized in that the width of the channel region is in at least one part greater than that of the channel zones adjacent to the source and drain regions.

According to another disclosed class of innovative embodiments, there is provided: Non-volatile memory cell with double level of polycrystalline silicon integrated monolithically in a substrate of semiconductor material and comprising a source region (38), a drain region (31), a channel region (34) between said source and drain regions, a floating gate (33), and a control gate (32) defined in said levels of polycrystalline silicon and separated by at least one layer of dielectric material (37) and both extending at least on the channel region which is covered by a thin layer of dielectric material (36) and characterized in that the width of the channel region is in at least one part greater than that of the channel zones adjacent to the source and drain regions and the area of the channel region is greater than that of a substrate region between the source and drain regions whose width is at all points equal to that of the two channel zones adjacent to the source and drain regions.

According to another disclosed class of innovative embodiments, there is provided: Non-volatile memory cell with double level of polycrystalline silicon integrated monolithically in a substrate of semiconductor material and comprising a source region (38), a drain region (31), a channel region (34) between said source and drain regions, a floating gate (33) and a control gate (32) defined in said levels of polycrystalline silicon and separated by at least one layer of dielectric material (37) and both extending at least on the channel region which is covered by a thin layer of dielectric material (36) and characterized in that the width of the channel region is in at least one part greater than that of the channel zones adjacent to the source and drain regions and the area of the channel region is greater than that of a substrate region between the source and drain regions whose width changes in a constant and uniform manner between the two channel zones adjacent to the source and drain regions.

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

What is claimed is:

1. An integrated circuit analog memory, comprising:
   a memory cell comprising
      source and drain diffusions of a first type, and a channel region separating said source diffusion from said drain diffusion;
      a first conductive thin film gate layer, overlying and capacitively coupled to and insulated from said channel region; and
      a second conductive thin film gate layer, overlying and capacitively coupled to and insulated from said first conductive thin film gate layer and said channel region;
      wherein each of said gate layers has a width over said channel which is greater than the width of said channel near said source and drain regions;
   sensing circuitry, connected to sense, and to provide a voltage output corresponding to, the charge stored in said memory cell, without applying current between source and drain thereof; and
   write circuitry, connected to controllably inject charge into said first conductive thin film layer of said memory cell;
   wherein said channel includes a widened portion, beneath said floating gate which is wider than portions of said channel nearer said source and drain regions.

2. The integrated circuit of claim 1, wherein said first conductive thin film layer is polycrystalline and has a composition which primarily comprises silicon.

3. The integrated circuit of claim 1, wherein said second conductive thin film layer is polycrystalline and has a composition which primarily comprises silicon.

4. The integrated circuit of claim 1, wherein said second conductive thin film layer is more than twice as wide as said channel near said source and drain regions.

5. The integrated circuit of claim 1, wherein said second conductive thin film layer is more than five times as wide as said channel near said source and drain regions.

6. An integrated circuit analog memory, comprising:
   a memory cell, comprising
      source and drain diffusions of a first type, and a channel region separating said source diffusion from said drain diffusion;
      a totally insulated first conductive thin film gate layer, overlying and capacitively coupled to said channel region; and
      a second conductive thin film gate layer, overlying and capacitively coupled to and insulated from said first conductive thin film gate layer and said channel region;
      wherein each of said gate layers has a width over said channel which is greater than the width of said channel near said source and drain regions;
   sensing circuitry, connected to sense, and to provide a voltage output corresponding to, the charge stored in said memory cell, without applying current between source and drain thereof; and
   write circuitry, connected to controllably inject charge into said first conductive thin film layer of said memory cell;
   wherein said channel includes a widened portion, beneath said floating gate, which is wider than portions of said channel nearer said source and drain regions.

7. The integrated circuit of claim 6, wherein said first conductive thin film layer is polycrystalline and has a composition which primarily comprises silicon.

8. The integrated circuit of claim 6, wherein said second conductive thin film layer is polycrystalline and has a composition which primarily comprises silicon.

9. The integrated circuit of claim 6, wherein said second conductive thin film layer is more than twice as wide as said channel near said source and drain regions.

10. The integrated circuit of claim 6, wherein said second conductive thin film layer is more than five times as wide as said channel near said source and drain regions.

11. An integrated circuit analog memory, comprising:
    a memory cell, comprising
       source and drain diffusions of a first type, and a channel region separating said source diffusion from said drain diffusion;
       a first conductive thin film gate layer, overlying and capacitively coupled to and insulated from said channel region; and
       a second conductive thin film gate layer, overlying and capacitively coupled to and insulated from said first conductive thin film gate layer and said channel region;
       wherein each said gate layer comprises an extended portion which is laterally extended over said channel in a direction which is not parallel to the source-drain axis, and which is laterally separated from said source and drain regions;
    sensing circuitry, connected to sense, and to provide a voltage output corresponding to, the charge stored in said memory cell, without applying current between source and drain thereof;
    wherein said channel includes a widened portion, beneath said floating gate, which is wider than portions of said channel nearer said source and drain regions.

12. The integrated circuit of claim 11, wherein said first conductive thin film layer is polycrystalline and has a composition which primarily comprises silicon.

13. The integrated circuit of claim 11, wherein said second conductive thin film layer is polycrystalline and has a composition which primarily comprises silicon.

14. The integrated circuit of claim 11, further comprising write circuitry, connected to controllably inject charge into said first conductive thin film layer of said memory cell.

15. The integrated circuit of claim 11, wherein said second conductive thin film layer is more than twice as wide as said channel near said source and drain regions.

16. The integrated circuit of claim 11, wherein said second conductive thin film layer is more than five times as wide as said channel near said source and drain regions.

17. An integrated circuit analog memory, comprising:
    a memory cell, comprising
       source and drain diffusions of a first type, and a channel region separating said source diffusion from said drain diffusion;
       a first conductive thin film gate layer, overlying and capacitively coupled to and insulated from said channel region; and a second conductive thin film gate layer, overlying and capacitively coupled to and insulated from said first conductive thin film gate layer and said channel region; and a first metal conductor, insulated from said first and second conductive thin film gate layer and said channel region, which makes ohmic contact to said source region;

a second metal conductor, insulated from said first and second conductive thin film gate layer and said channel region, which makes ohmic contact to said drain region;

wherein each said gate layer has a width over said channel which is greater than the width thereof near said source and drain regions;

sensing circuitry, connected to sense, and to provide a voltage output corresponding to, the charge stored in said memory cell, without applying current between source and drain thereof;

wherein said channel includes a widened portion, beneath said floating gate, which is wider than portions of said channel nearer said source and drain regions.

18. The integrated circuit of claim 17, wherein said first conductive thin film layer is polycrystalline and has a composition which primarily comprises silicon.

19. The integrated circuit of claim 17, wherein said second conductive thin film layer is polycrystalline and has a composition which primarily comprises silicon.

20. The integrated circuit of claim 17, further comprising write circuitry, connected to controllably inject charge into said first conductive thin film layer of said memory cell.

21. The integrated circuit of claim 17, wherein said second conductive thin film layer is more than twice as wide as said channel near said source and drain regions.

22. The integrated circuit of claim 17, wherein said second conductive thin film layer is more than five times as wide as said channel near said source and drain regions.

* * * * *

UNITED STATES PATENT AND TRADEMARK OFFICE
CERTIFICATE OF CORRECTION

PATENT NO. : 5,592,418

DATED : January 7, 1997

INVENTOR(S) : Sabatini, et al.

Page 1 of 3

It is certified that error appears in the above-identified patent and that said Letters Patent is hereby corrected as shown below: In the drawings:

Sheet 2 of 6, amend Figure 9 to show Figure 9A and 9B as the plot and circuit, respectively.

Column 2, Line 42, change "domain," to --domain.--;
Column 2, Line 45, change "cell," to --cell.--;
Column 2, Line 49, change "invention," to --invention.--;
Column 2, Line 52, change "present," to --present.--;
Column 2, Line 54, change "cell," to --cell.--;
Column 2, Line 55, delete "and";
Column 2, Line 59, change "12" to --9A--;
Column 2, Line 61, change "9" to --9B--.

Figure 17:
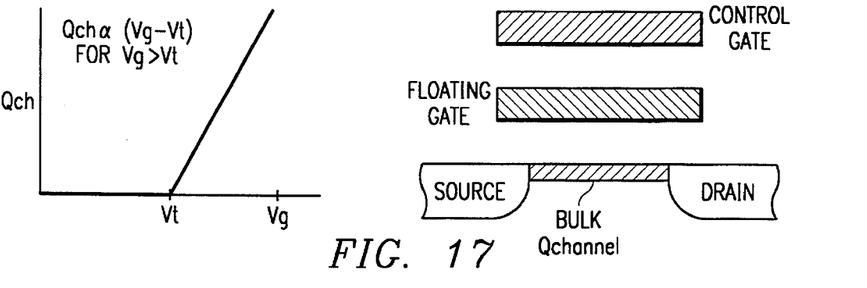

Column 3, after "7.", insert a new paragraph with indentation stating the following, --Figure 17 shows the charge accumulated in the channel region, in relation to the gate voltage and threshold voltage.-- Line 12;
Column 3, Line 47, change "gate" to --gate 23--;
Column 3, Line 67, change "changed" to --unchanged--.

UNITED STATES PATENT AND TRADEMARK OFFICE
CERTIFICATE OF CORRECTION

PATENT NO. : 5,592,418
DATED : January 7, 1997
INVENTOR(S) : Sabatini, et al.

It is certified that error appears in the above-identified patent and that said Letters Patent is hereby corrected as shown below:

Column 4, Line 2, change "region, value," to --region,--;
Column 4, Line 27, change "accumulated" to --accumulated channel--;
Column 4, Line 35, change "(Cch)" to --Cch--;
Column 4, Line 37, change "(28)" to --28--;
Column 4, Line 37, change "(21)" to --21--;
Column 4, Line 39, change "(Cfs)" to --Cfs--;
Column 4, Line 39, change "(Cfd)" to --Cfd--;
Column 4, Line 43, change "(22)" to --22--;
Column 4, Line 43, change "(28)" to --28--;
Column 4, Line 47, change "(Cch)" to --Cch--.

Column 5, Line 32, change "12" to --9A--;
Column 5, Line 35, change "9" to --9B--;
Column 5, Line 53, change "9." to --9B.--;
Column 5, Line 62, change "Q(V)" to --Q-V--.

Column 6, Line 4, insert new paragraph with indentation, stating the following, --Figure 17 shows the charge accumulated in the channel region, in relation to the gate voltage and threshold voltage.--;
Column 6, Line 7, change "Vgs=.9.0" to --Vgs=9.0--;
Column 6, Line 14, change "9" to --9B--.

UNITED STATES PATENT AND TRADEMARK OFFICE
CERTIFICATE OF CORRECTION

PATENT NO. : 5,592,418
DATED : January 7, 1997
INVENTOR(S) : Sabatini, et al.

It is certified that error appears in the above-identified patent and that said Letters Patent is hereby corrected as shown below:

```
Column 7, Line 14, change "12" to --17--;
Column 7, Line 20, change "9" to --9A--.

Column 8, Line 19, change "MV" to --mV--.

Column 9, Line 30, change "to," to --to--;
Column 9, Line 48, change "to," to --to--.

Column 10, Line 1, change "to," to --to--.
```

Signed and Sealed this

Fifth Day of May, 1998

Attest:

BRUCE LEHMAN

Attesting Officer

Commissioner of Patents and Trademarks